(12) United States Patent
Palmans et al.

(10) Patent No.: US 6,663,915 B2
(45) Date of Patent: Dec. 16, 2003

(54) METHOD FOR COPPER PLATING DEPOSITION

(75) Inventors: Roger Palmans, Riemst (BE); Yuri Lantasov, Minsk (BY)

(73) Assignee: Interuniversitair Microelektronica Centrum, Leuven (BE)

( * ) Notice: Subject to any disclaimer, the term of this patent is extended or adjusted under 35 U.S.C. 154(b) by 0 days.

(21) Appl. No.: 10/012,686

(22) Filed: Nov. 13, 2001

(65) Prior Publication Data

US 2002/0152926 A1 Oct. 24, 2002

(30) Foreign Application Priority Data

Nov. 28, 2000 (EP) .............................. 00870283

(51) Int. Cl.[7] .............................. B05D 1/18; B05D 5/12; B05D 3/10
(52) U.S. Cl. .......................... 427/98; 427/97; 427/304; 427/305; 427/307; 427/437; 427/443.1
(58) Field of Search ................. 427/304, 305, 427/307, 97, 98, 437, 443.1; 438/678

(56) References Cited

U.S. PATENT DOCUMENTS

| | | | | |
|---|---|---|---|---|
| 4,652,345 A | * | 3/1987 | McBride et al. | ............... 205/86 |
| 5,891,513 A | * | 4/1999 | Dubin et al. | ................. 427/98 |
| 6,054,172 A | | 4/2000 | Robinson et al. | |
| 6,054,173 A | | 4/2000 | Robinson et al. | |
| 6,126,989 A | | 10/2000 | Robinson et al. | |
| 6,316,359 B1 | * | 11/2001 | Simpson | ..................... 438/678 |

FOREIGN PATENT DOCUMENTS

| | | | | |
|---|---|---|---|---|
| JP | | 2000204481 A | * 7/2000 | ........... C23C/18/40 |
| WO | | WO 99/10916 | 3/1999 | |

OTHER PUBLICATIONS

European Search Report; EP 00 87 0283, Feb. 2001.

* cited by examiner

*Primary Examiner*—Michael Barr
(74) *Attorney, Agent, or Firm*—Knobbe Martens Olson & Bear LLP (57) ABSTRACT

The present invention describes a method for copper deposition on a substrate having a barrier layer wherein a substrate (2) and an activator (1) are immersed in a copper plating bath in order to contact each other for a predetermined period.

19 Claims, 6 Drawing Sheets

Fig.1

| Deposition time (sample) | |
|---|---|
| 3 min (923/15E) |  |
| 5 min (923/15C) |  |
| 10 min (923/15A) |  |

METHOD FOR COPPER PLATING DEPOSITION

FIELD OF THE INVENTION

The present invention is related to metal deposition processes as used for instance for the formation of conductive patterns connecting active or passive devices as well as integrated circuits. In particular, such conductive patterns can be formed at least partly by means of a plating deposition technique.

BACKGROUND OF THE INVENTION

Electroless deposition has been used in the electronic packaging and the printed circuit board industry as a very efficient and cheap deposition technique for the production of thick films and for via-hole plating. To incorporate its use into the microelectronics industry, the reliability and quality of submicron lines and via's generated by electroless deposition is a key issue.

The electroless deposition method involves the formation of a thin film of material from a plating bath without external electric current. The deposition is due to an electrochemical reaction between the metal ions, a reducing agent, a complexing agent, and pH adjusters on a catalytic surface. The deposition occurs by simultaneous oxidation-reduction reactions between two half reactions involving electron generation and electron reduction. The metal cations in the solution accept electrons at the deposition surface, get reduced, and are deposited as metal. A catalytic surface usually consists of either: 1) a surface which has been activated for instance with palladium nuclei, 2) a thin evaporated or sputtered seed of a noble metal like gold, platinum or palladium, or 3) an insulator (or non-catalytic semiconductor or metal) which is sensitised by coating it with a thin metal that can be less than a mono-layer. Once a thin layer of metal has been deposited onto the seed layer or sensitised surface, electroless deposition continues autocatalytically, since the metallic film is also a good catalyst for electroless growth.

For trench or via-hole plating, European Patent EP1020543 has proposed an original copper electroless plating bath fulfilling the stringent requirements for copper plating in sub-micro high aspect ratio features onto typical Cu diffusion barrier layer such as Ti, TiN, Ta, TaN, $WN_x$, Ni, Ni-alloy and Co barrier-layers.

However, in order to obtain good quality electroless copper deposition on these barrier layers, first an activation step with deposition of palladium nuclei onto the barrier layer is required.

Moreover, the critical step for obtaining a catalytic surface to initiate copper deposition is still present.

Document WO 99/10916 claiming the priority of document U.S. Pat. No. 6,054,173 and related patents U.S. Pat. No. 6,054,172 and U.S. Pat. No. 6,126,989 disclose methods for eletroless deposition of copper on a titanium-containing surface of a substrate. One method for depositing copper on a substrate includes providing the substrate having a titanium-containing surface and forming a patterned catalyst material on the substrate, such that the titanium-containing surface is exposed in selected regions. Preferably, the catalyst material is selected from the group consisting of silicon, aluminium and chromium. The titanium-containing surface can be titanium or titanium nitride. Copper is then deposited on the exposed regions of the titanium-containing surface from an electroless solution preferably containing a source of copper and a reducing agent. The pH of said electroless solution is about 9 to 12.

AIMS OF THE INVENTION

One aim of the present invention is to initiate copper deposition from a plating solution directly on said barrier layers without requiring the above mentioned palladium activation step.

Another aim of the invention is to provide a new method for a conform and high quality copper deposition on barrier layers.

SUMMARY OF THE INVENTION

The invention discloses a new method for copper deposition on a substrate having a barrier layer characterized in that a substrate is immersed in a copper plating bath, and that
an activator is also immersed in said copper bath and
direct contact is performed between said activator and said substrate for a predetermined period.

Preferably, the substrate is cleaned in a diluted HF solution, typically a 0.5 w %–10 w % HF solution, before it is immersed in the copper plating bath, in order to remove any native oxide.

A physical contact is necessary between the activator and the substrate for the copper deposition to occur.

The copper plating bath can be either a standard electroless plating bath or a plating bath without reducing agent.

The activator is preferably a contact metal which comprises at least an element selected from the group comprising Al, Zn and Pd.

Said activators may act according to two different mechanisms. When the activator is Al or Zn, it acts according to a first mechanism, wherein the activator has to be dissolved in the copper plating bath for copper deposition to occur on the substrate. When the activator is Pd, such a dissolution is not necessary. Pd acts according to a second mechanism, namely a self-limiting mechanism.

It has been established that Si and Cr can not work as activators.

The barrier layer is preferably selected from the group comprising a Ti layer, a TiN layer, a $WN_x$, layer, Ta, TaN, Ni and Ni-alloy barrier-layers, a Co layer and Co-alloy barrier layers.

The copper plating bath preferably comprises at least:

a source of Cu (II) ions
a complexing agent to keep the Cu(II) ions in solution at high pH values
an additive to adjust the pH of said bath.

Preferably, said completing agent is diethyl-tartrate.

This copper plating bath can also comprise a reducing agent, preferably formaldehyde or hypophosphite.

The pH of the copper plating bath is comprised between 12.0 and 13.5. It has been shown that no copper deposition may occur if the pH of the copper plating bath is below 12.0.

The predetermined time period for direct contact between the two samples is preferably comprised between 10 sec. and 30 min.

The activator may have a determined shape. It can be in the form of a clamping ring or metal contacts placed on the wafer edge in contact with the barrier layer.

The method according to the present invention is preferably used for contact plated copper deposition on an opening (trench or via) in a substrate having a blanket barrier layer.

DESCRIPTION OF SEVERAL EMBODIMENTS OF THE INVENTION

Figure 1:
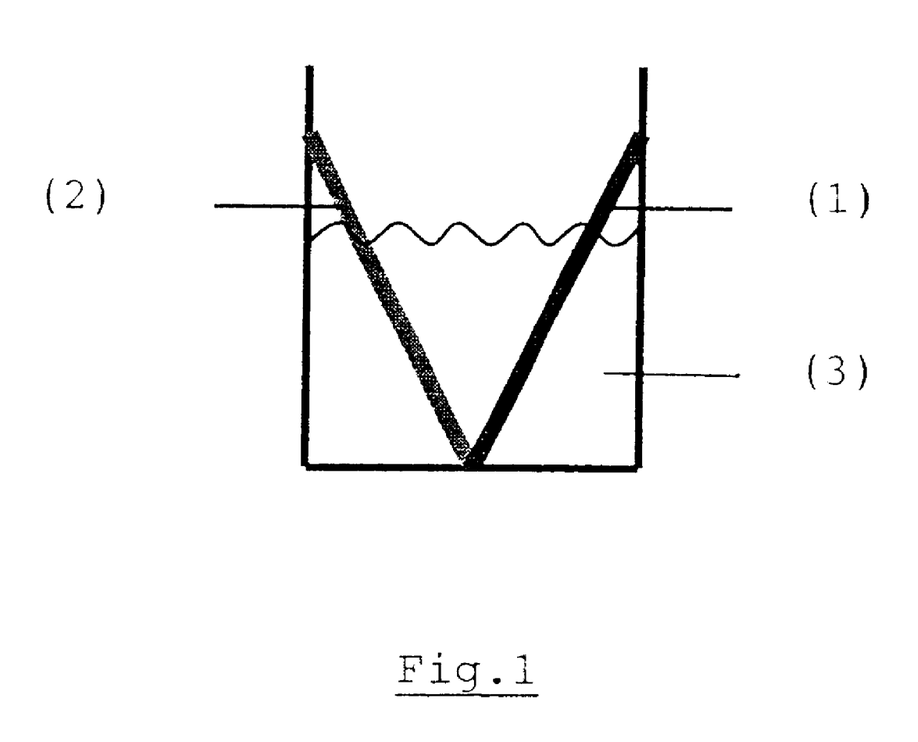
FIG. 1 is describing a basic experiment involved in the first aspect of the present invention.

FIG. 1 is describing a basic embodiment wherein a barrier layer on a substrate (2), hereafter referred to as sample 2, has been brought into contact with an Al-sample (1), hereafter referred to as sample 1 and is immersed in a bath (3) being either a conventional electroless plating bath or a plating bath without a reducing agent. It is observed that Cu is deposited on the barrier layer if a contact occurs between the two samples. In the absence of contact between the two samples, no copper is deposited on the barrier layer. Also, it is observed that addition of Al(III) ions to the plating solution does not lead to copper deposition when no aluminium contact exists. Several other experiments have been performed based on the same experiment wherein:

(i) sample 1 is an Al-sample which can be:
Al alloy covered wafer: Pieces of wafer HLI (400 nm LLS Al-0.5%Cu on $SiO_2$/Si)
or any aluminium substrate that can be brought into contact with the barrier layer (strips, foils, . . . );

(ii) sample 2 is a wafer having on its top a barrier layer which can be:
TiN: Pieces of wafers TR9800923 (15 nm/60 m IMP Endura Ti/TiN on SiO2/Si). These samples are cleaned previously in 2,5% HF for 1 min (or in 5% HF for 30 sec)
$WN_x$: Pieces of wafer TR9800482 #05 (60 nm $WN_x$ on SiO2/Si)
Co: Pieces of wafer TMPA #6 (60 nm Co on $SiO_2$/Si)
TaN: Pieces of wafer CU9850 #6 (60 nm Endura TaN on $SiO_2$/Si)
or TaN: Pieces of wafer TR9801029 #24 (60 nm Endura Ta on $SiO_2$/Si).

In a first embodiment of the present invention, the plating solution contains formaldehyde as reducing agent. The pH of solution has to be above 12.0.

It is observed that deposition occurs when the barrier layer of sample 2 is TiN, $WN_x$ or Co. No deposition is observed in the case of TaN nor Ta because the cleaning time with HF solution was too short. However, for longer cleaning times or with more concentrated HF cleaning solutions, copper deposition occurs with TaN or Ta as barrier layer. The results are summarised in Table 1.

Based on the same experiment as described in FIG. 1, new experiments have been performed with the same solution but without formaldehyde and having a pH above 12.5 and wherein:

(i) sample 1 is:
Al foil with a thickness of 0.32 mm and a width of 30 mm or an Al-covered wafer (ii) the barrier layer on sample 2 is:
TiN: Pieces of wafers TR9801064 #23 and CU99119 #3,4 (ARC Encura Ti/TiN on $SiO_2$/Si). Samples are cleaned previously in 2,5% HF for 1 min (or in 5% HF for 30 sec).
$WN_x$: wafer TR9800482 #02 (60 nm $WN_x$ on $SiO_2$/Si).
Co: Pieces of wafer TMPA #6, wafer TMPA #5 (60 nm Co on $SiO_2$/Si).
TaN: Pieces of wafer CU9850 #6 (60 nm Endura TaN on $SiO_2$/Si).
or Ta: Pieces of wafer TR9801029 #24 (60 nm Endura Ta on $SiO_2$/Si).

The results are summarised in Table 2 for TiN samples only.

Figure 2:
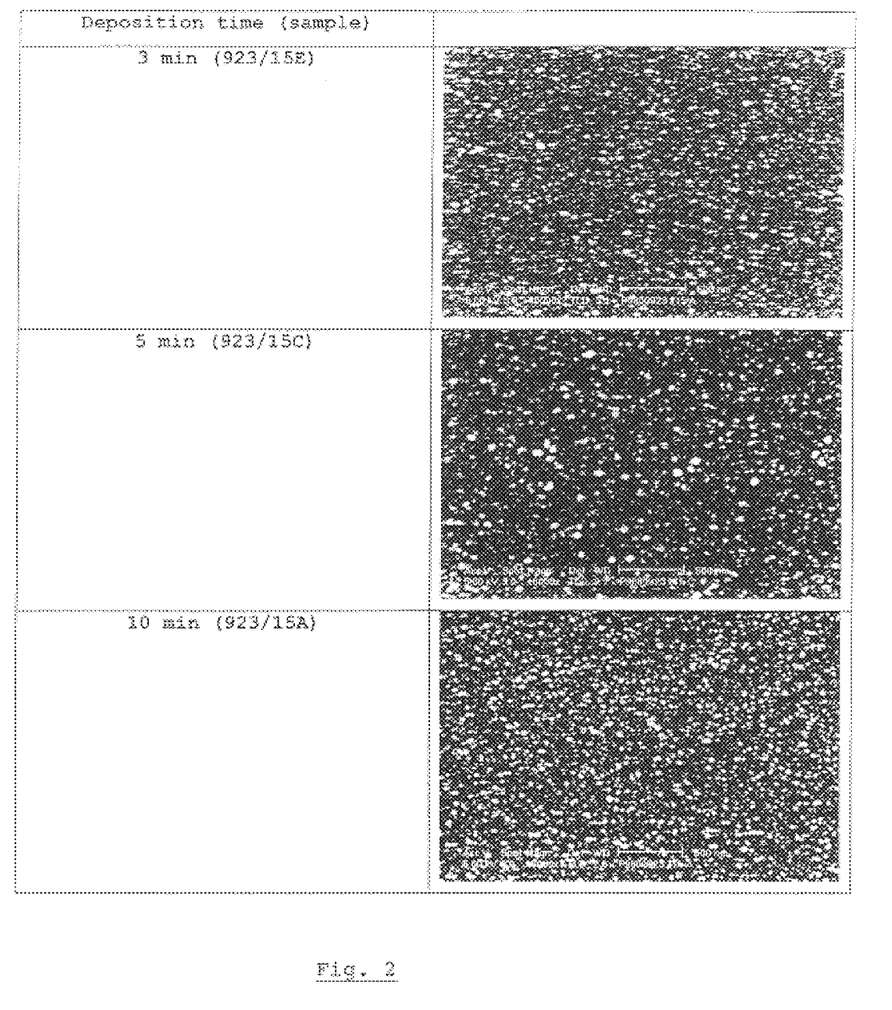
FIG. 2 shows SEM pictures of Cu deposition on TiN by Al contact plating.

SEM pictures of Cu deposition on TiN by Al contact plating and corresponding to this experiment are presented on FIG. 2.

Other embodiments similar to those described in FIG. 1 have been undertaken with a conventional sodium hypophosphite electroless plating bath. In this case the pH is above 12.5. In these experiments, sample 1 is an Al sample, sample 2 has a TiN barrier layer.

Figure 3:
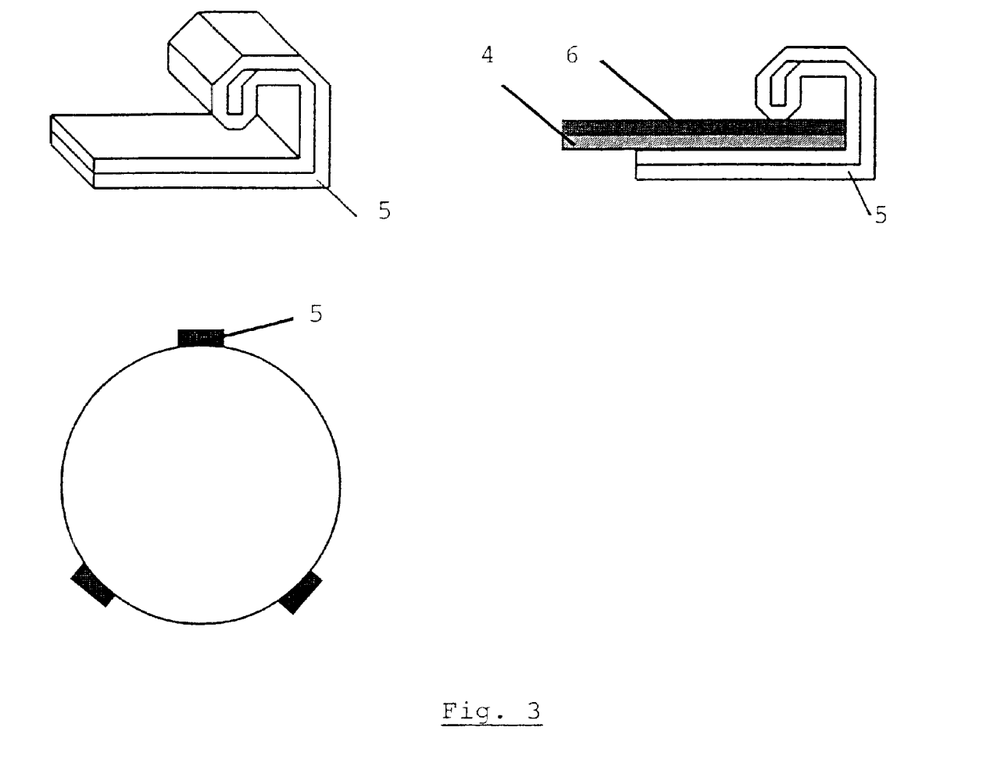
FIG. 3 shows a device dedicated to an industrial process for contact plated copper deposition, according to one preferred embodiment of the invention.

In order to have a best mode embodiment it is suggested to perform the Al-sample in the form of an Al-clamping holder which would clamp the wafer having the barrier layer. FIG. 3 is showing such a device used in one preferred embodiment of the present invention that comprises a wafer (4) and 3 Al holders (5). The wafer (4) is typically a Si/SiO2 wafer having a Ti, TiN, Ta, TaN, $WN_x$, Ni, Ni-alloy or Co barrier-layer (6). The Al holders (5) are made from Al foil and have the shape of clamping holders. In this experiment, each Al holder has a surface area of (130×30+20×130×0.32+2×30×0.32) $mm^2$.

Figure 4:
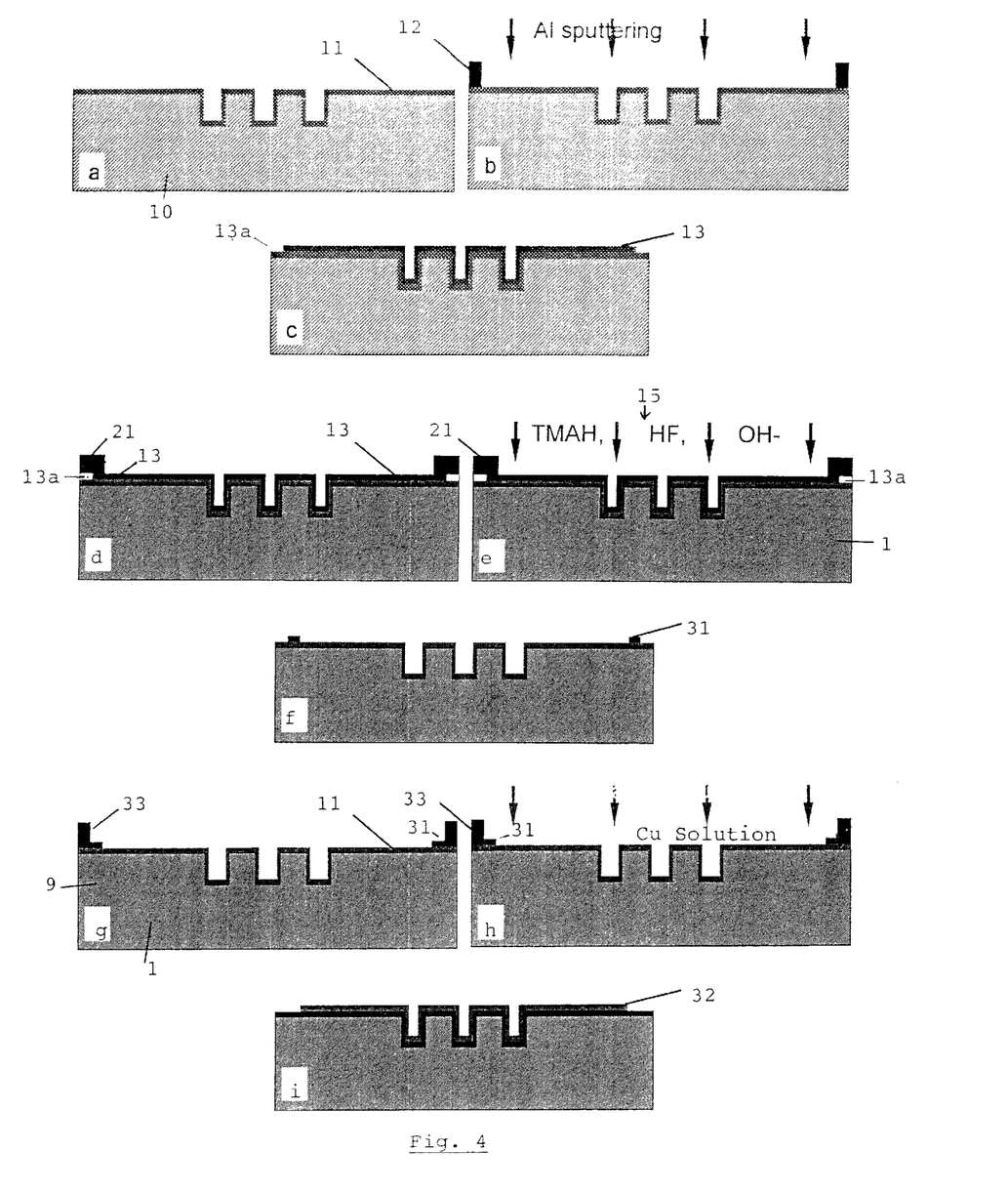
FIG. 4 represents the several steps of a process for contact plated copper deposition according to another preferred embodiment of the invention.

Another best mode of using the method according to the present invention is described in FIG. 4, wherein the aluminium ring is formed directly on the barrier layer surface during processing. This best mode embodiment consists of the following steps:

(a) deposition of a barrier layer (11) typically Ti, TiN, Co, Ta, TaN, Ni, Ni alloy or $WN_x$ on a wafer (10), (b) fixing a first clamping ring (12) on the top surface of said barrier layer and Al sputtering on said wafer, (c) removing the clamping ring (12) from the wafer, so that an area (13a) on the barrier layer is not covered by the Al layer (13), (d) fixation of a second clamping ring (21) covering the whole zone (13a) and partially the Al layer (13) on the top surface of the wafer (1), (e) etching of Al in central part (15) of the wafer (1) in a plating tool by either hydroxide solution (NaOH, Tetramethylammonium hydroxide (TMAH), . . . ) or by an acidic solution (HF, HCl, . . . ), (f) after the Al layer has disappeared, said second clamping ring (21) is removed from the wafer, so that only a small portion in the form of a ring of Al still remains directly in contact with the barrier layer (11) on the wafer (1).

(g) A third clamping ring (33) is fixed on one extremity of the wafer on the top surface so that the Al contact is exposed to the plating solution.

(h) Cu plating is initiated on the exposed barrier layer (11) due to dissolution of the Al ring (31).

(i) Finally the third clamping ring (33) is removed and a wafer (1) having a barrier layer (11) covered with a Cu layer (32) except on its extremities is obtained.

The Al sputtering in step (b) can also be done in a tool without a clamping ring on said wafer.

Experiments have been performed to check copper deposition on full wafers according to one preferred embodiment of the present invention (Table 3). In these experiments, sample 1 is an Al holder or an Al ring and sample 2 a Co, a $WN_x$ or a TiN covered wafer. The solution is a copper plating solution without formaldehyde and having a pH above 12.5.

Figure 5:
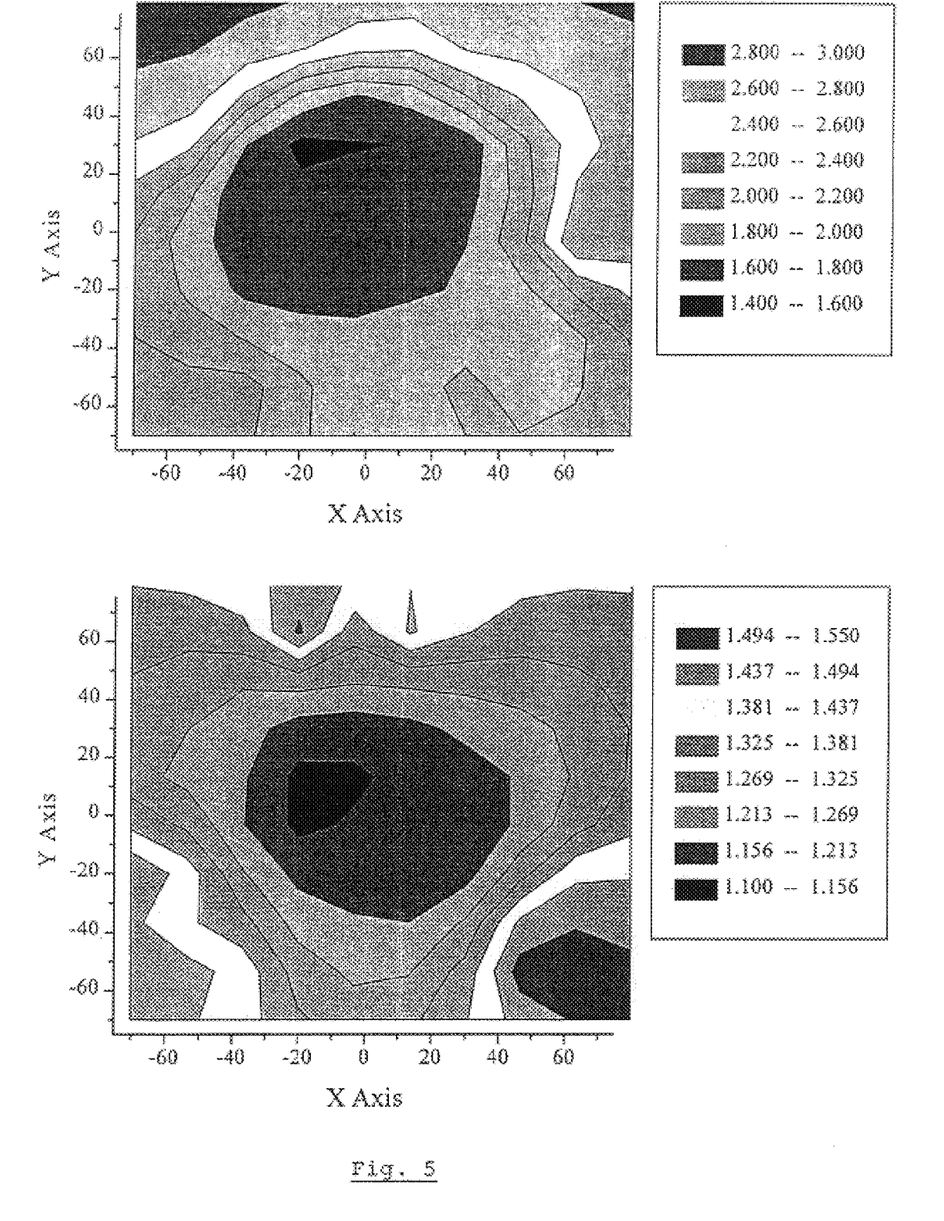
FIG. 5 represents typical sheet resistance mappings over 6 inch wafers obtained with the copper deposition process according to the present invention.

Sheet resistance mappings measured for these wafers are presented in FIG. 5.

Figure 6A:
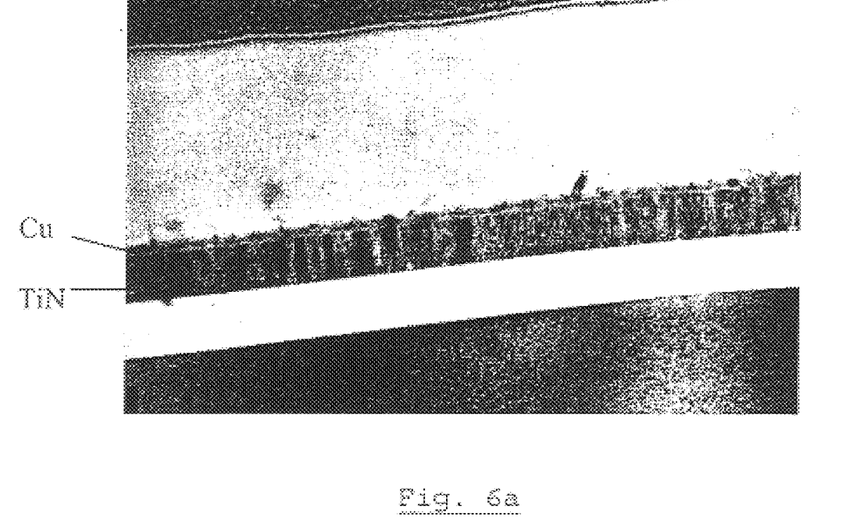
FIG. 6a represents a TEM picture of Cu deposition on a TiN covered wafer using a copper plating bath with formaldehyde as reducing agent.
Figure 6B:
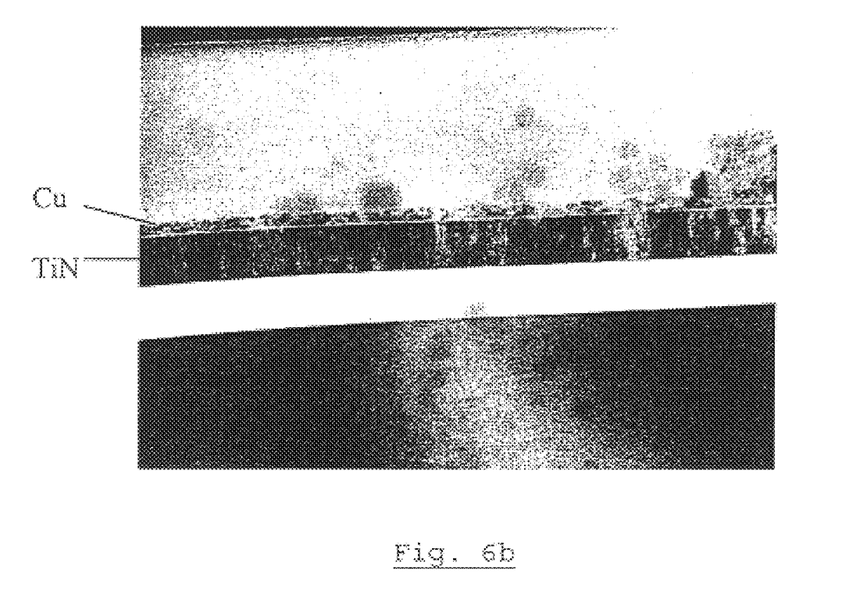
FIG. 6b represents a TEM picture of Cu deposition on a TiN covered wafer using a copper plating bath without formaldehyde as reducing agent.

Moreover, two distinct experiments for copper deposition on TiN covered wafers according to another preferred embodiment of the invention have been performed, both using the same copper deposition time, but the first one using a copper plating bath with formaldehyde at pH=12.42, while the second using a copper plating bath without formaldehyde at pH=13.0. These two experiments lead to copper covered wafers with different deposition rates: the copper covered wafer has a resistance of 1.97 Ω/sq. and a thickness of 24.4 nm in the first experiment and the copper covered wafer has a resistance of 3.815 Ω/sq. and a thickness of 18.7 nm. TEM pictures illustrating these results are presented in FIG. 6a and FIG. 6b, for the first and the second experiments respectively.

TABLE 1

| Sample2 | Deposition time (min) | Resistance (Ω/sq) | Thickness (nm) | Resistivity (μΩ cm) | Adhesion |
|---|---|---|---|---|---|
| Co | 3 | 1.522 | 23.5 | 4.30 | Ok |
| $WN_x$ | 5 | 2.14 | 19.9 | 5.59 | Ok |
| TiN | 5 | 1.4695 | 45.6 | 8.01 | Bad |
| TiN | 10 | 0.5945 | 90.0 | 5.73 | Bad |
| TiN | 15 | 0.3785 | 127.4 | 5.03 | Bad |
| TiN | 20 | 0.263 | 178.9 | 4.85 | Bad |

TABLE 2

| Sample2 | Deposition time (min) | Resistance (Ω/sq) | Thickness (nm) | Resistivity (μΩ cm) | Adhesion |
|---|---|---|---|---|---|
| TiN | 3 | 3.46 | 11.8 | 6.63 | Ok |
| TiN | 5 | 1.8705 | 30.7 | 7.25 | Ok |
| TiN | 10 | 1.194 | 52.9 | 7.28 | Bad |

TABLE 3

| Sample2 | Deposition time (min) | Resistance (Ω/sq) | Thickness (nm) | Resistivity (μΩ cm) | Adhesion |
|---|---|---|---|---|---|
| Co | 10 | 0.88597 | 114 | 4.28 | Ok |
| Co | 5 | 1.3611 | | | Ok |
| $WN_x$ | 3.5 | 1.9624 | | | Bad |
| TiN | 3 | 3.3044 | 45.9 | 20.24 | Ok |

What is claimed is:

1. A plating method for copper deposition on a substrate having a barrier layer, the method comprising the steps of:

immersing the substrate in a copper plating bath;

immersing an activator comprising a contact metal in said copper plating bath, whereby said contact metal is dissolved in said copper plating bath to yield a reducing agent; and performing a direct contact between said activator and said substrate for a time period, whereby copper is deposited on said substrate.

2. The method according to claim 1, wherein said contact metal comprises at least one element selected from the group consisting of Al and Zn.

3. The method according to claim 1, wherein said barrier layer is selected from the group consisting of a Ti layer, a TiN layer, a $WN_x$ layer, a Ta layer, a TaN layer, a Ni layer, a Ni-alloy layer, a Co layer, and a Co-alloy layer.

4. The method according to claim 1, wherein said copper plating bath comprises:

a source of Cu (II) ions;

a complexing agent, said complexing agent capable of maintaining Cu(II) ions in solution at a pH above 12.0; and an additive, said additive capable of adjusting a pH of said bath.

5. The method according to claim 4, wherein said copper plating bath, prior to said step of immersing the activator, does not comprise a reducing agent.

6. The method according to claim 4 or 5, wherein said complexing agent comprises diethyl-tartrate.

7. The method according to claim 1, further comprising the step of:

cleaning said substrate in a diluted HF solution whereby a native oxide is removed, and wherein said cleaning is conducted before the step of immersing the substrate.

8. The method according to claim 1, wherein said copper plating bath has a pH between 12.0 and 13.5.

9. The method according to claim 1, wherein said time period is between 10 sec. and 30 mm.

10. The method according to claim 1, wherein the activator has a determined shape.

11. The method according to claim 10, wherein said determined shape of said activator is a clamping holder.

12. The method according claim 10, wherein said determined shape of said activator is a clamping ring.

13. The method according to claim 1, whereby copper is deposited on a trench in said substrate or on a via in said substrate.

14. The method according to claim 7, wherein said diluted HF solution has an HF concentration of between 0.5 wt. % and 10 wt. %.

15. The method according to claim 1, wherein said contact metal comprises Al.

16. The method according to claim 1, wherein said contact metal comprises Zn.

17. A plating method for copper deposition on a substrate having a barrier layer, the method comprising the steps of:

immersing the substrate in a copper plating bath, wherein said copper plating bath comprises a source of Cu (II) ions, a complexing agent capable of maintaining Cu(II) ions in solution at a pH above 12.0, and an additive capable of adjusting a pH of said bath, and wherein said copper plating bath does not comprise a reducing agent;

immersing an activator in said copper plating bath; and performing a direct contact between said activator and said substrate for a time period, whereby copper is deposited on said substrate.

18. A plating method for copper deposition on a substrate having a barrier layer, the method comprising the steps of:

immersing the substrate in a copper plating bath;

immersing an activator in said copper plating bath, wherein the activator has a determined shape, and wherein said determined shape of said activator is a clamping holder; and performing a direct contact between said activator and said substrate for a time period, whereby copper is deposited on said substrate.

19. A plating method for copper deposition on a substrate having a barrier layer, the method comprising the steps of:

immersing the substrate in a copper plating bath;

immersing an activator in said copper plating bath, wherein the activator has a determined shape, and wherein said determined shape of said activator is a clamping ring; and performing a direct contact between said activator and said substrate for a time period, whereby copper is deposited on said substrate.

* * * * *